United States Patent
Miller et al.

(10) Patent No.: US 12,051,864 B2
(45) Date of Patent: Jul. 30, 2024

(54) GUIDE MODULE WITH INTEGRATED CONNECTOR PROTECTION

(71) Applicant: TE CONNECTIVITY SERVICES GMBH, Schaffhausen (CH)

(72) Inventors: Keith Edwin Miller, Middletown, PA (US); Kyle Gary Annis, Middletown, PA (US)

(73) Assignee: TE Connectivity Solutions GmbH (CH)

( * ) Notice: Subject to any disclaimer, the term of this patent is extended or adjusted under 35 U.S.C. 154(b) by 241 days.

(21) Appl. No.: 17/494,060

(22) Filed: Oct. 5, 2021

(65) Prior Publication Data
US 2023/0106932 A1    Apr. 6, 2023

(51) Int. Cl.
*H01R 12/70* (2011.01)
*H05K 7/14* (2006.01)

(52) U.S. Cl.
CPC ....... *H01R 12/7005* (2013.01); *H05K 7/1438* (2013.01)

(58) Field of Classification Search
CPC  H01R 13/629; H01R 13/645; H01R 13/6456; H01R 12/7005; H05K 7/1438; H05K 7/1454
USPC .......................................... 439/377, 378, 65
See application file for complete search history.

(56) References Cited

U.S. PATENT DOCUMENTS

| | | | | |
|---|---|---|---|---|
| 4,998,892 A * | 3/1991 | Shiley | ............. | H01R 13/631 439/378 |
| 5,544,008 A * | 8/1996 | Dimmick | ............. | G06F 1/185 361/753 |
| 6,805,575 B2 * | 10/2004 | Lappohn | ............. | H01R 13/642 439/381 |
| 7,079,381 B2 * | 7/2006 | Brehm | ............. | H05K 7/1454 398/79 |
| 7,241,149 B2 * | 7/2007 | Abadia | ............. | H01R 12/7005 439/378 |
| 7,865,326 B2 * | 1/2011 | Johnson | ............. | G01D 11/24 710/301 |
| 7,887,361 B2 * | 2/2011 | Costello | ............. | H05K 13/0015 439/378 |
| 7,974,093 B2 * | 7/2011 | Zeng | ............. | H05K 7/20545 361/704 |
| 8,199,494 B2 * | 6/2012 | Nguyen | ............. | H05K 7/1428 361/740 |

(Continued)

OTHER PUBLICATIONS

ANSI/VIA 48.2-2020 Mechanical Specification for Microcomputers Using REDI Conduction Cooling Applied to VITA 46, 54 pages, Jul. 10, 2020, www.vita.com.

(Continued)

*Primary Examiner* — Marcus E Harcum

(57) ABSTRACT

A guide module for use with a plug-in module assembly to properly position the plug-in module in a slot of a chassis. The guide module has a leading surface and oppositely facing trailing surface. The guide module has a top wall, a bottom wall, a first inside side wall and an oppositely facing second outside side wall. The leading surface of the guide module extends beyond a leading end of the plug-in module assembly. As the plug-in module is inserted into the chassis, the leading surface of the guide module prevents damage to other components of the plug-in module assembly.

8 Claims, 7 Drawing Sheets

(56) References Cited

U.S. PATENT DOCUMENTS

| | | | | |
|---|---|---|---|---|
| 8,721,348 B2* | 5/2014 | Costello | ............... | H05K 7/1438 |
| | | | | 439/377 |
| 8,951,055 B2* | 2/2015 | Eusterholz | ......... | H01R 13/6315 |
| | | | | 439/378 |
| 9,673,559 B1* | 6/2017 | Rossman | ........... | H01R 12/7011 |
| 9,730,357 B2 | 8/2017 | Simpson | .............. | H05K 7/1492 |
| 9,735,481 B2 | 8/2017 | Costello | ............... | H01R 9/2408 |
| 9,801,301 B1* | 10/2017 | Costello | .................. | H04Q 1/15 |
| 9,843,140 B1* | 12/2017 | Rossman | ............... | H01R 12/91 |
| 10,038,262 B1* | 7/2018 | Behziz | ............... | H01R 12/7082 |
| 10,098,253 B1 | 10/2018 | Hocker et al. | | |
| 10,136,196 B2* | 11/2018 | Ritter | ....................... | H04Q 1/15 |
| 10,367,297 B2* | 7/2019 | Rossman | ............... | F16B 35/044 |
| 10,558,000 B2* | 2/2020 | Miller | .................. | G02B 6/3817 |
| 2005/0215107 A1* | 9/2005 | Castello | ............... | H05K 7/1454 |
| | | | | 439/378 |
| 2005/0239317 A1* | 10/2005 | Margulis | .............. | H01R 12/712 |
| | | | | 439/378 |
| 2006/0079113 A1* | 4/2006 | Minich | ................ | H01R 12/716 |
| | | | | 439/378 |
| 2007/0037434 A1* | 2/2007 | Fedder | ............... | H01R 12/7005 |
| | | | | 439/378 |
| 2009/0269947 A1* | 10/2009 | Costello | ............. | H01R 13/7031 |
| | | | | 439/64 |
| 2010/0311268 A1* | 12/2010 | Nguyen | ............. | H01R 13/6456 |
| | | | | 439/378 |
| 2011/0256753 A1* | 10/2011 | Gulla | ................ | H01R 13/6453 |
| | | | | 439/378 |
| 2013/0093453 A1* | 4/2013 | Sakata | ................... | H01R 12/00 |
| | | | | 439/65 |
| 2013/0183850 A1* | 7/2013 | Kogotani | ........... | H01R 12/7005 |
| | | | | 439/378 |
| 2014/0004723 A1* | 1/2014 | Costello | ............... | H05K 7/1438 |
| | | | | 439/64 |
| 2014/0273551 A1* | 9/2014 | Resendez | ............ | H01R 12/737 |
| | | | | 439/65 |
| 2014/0302706 A1* | 10/2014 | YuQiang | ................ | H01R 13/64 |
| | | | | 439/378 |
| 2015/0111421 A1* | 4/2015 | Rossman | ........... | H01R 13/6315 |
| | | | | 439/527 |
| 2015/0200474 A1* | 7/2015 | Rossman | ............... | H01R 12/91 |
| | | | | 439/64 |
| 2016/0294081 A1* | 10/2016 | Tsang | ..................... | H01R 12/91 |
| 2019/0176298 A1* | 6/2019 | Woodman, III | ....... | H01R 43/22 |
| 2019/0372256 A1* | 12/2019 | Phillips | .............. | H01R 12/7005 |
| 2021/0288444 A1 | 9/2021 | Miller et al. | | |

OTHER PUBLICATIONS

European Search Report European Application No. 22199358.7.

* cited by examiner

GUIDE MODULE WITH INTEGRATED CONNECTOR PROTECTION

FIELD OF THE INVENTION

The present invention is directed to a guide module for use with a plug-in module assembly. In particular, the invention is directed to a guide module which is mounted to the plug-in module assembly to limit potential damage to an electrical connector mounted on the plug-in module assembly.

BACKGROUND OF THE INVENTION

It is known to insert plug-in module assemblies into chassis to allow the plug-in module assemblies to be provided in electrical and mechanical contact with a backplane. The chassis have slots into which the plug-in module assemblies are inserted. The plug-in module assemblies are often controlled by standards, such as ANSI/VITA 48.2-2020 which define the critical dimensions for the plug-in module assemblies to ensure that mechanical interchangeability of the plug-in module assemblies, to achieve enhanced packaging density by allowing increased utilization, and provide sufficient volume for features that can improve both the thermal and structural characteristics.

However, in many applications, there is not a direct line of sight with the slots, making the slots of the chassis difficult to see as the plug-in module assemblies are inserted into the slots of the chassis. This can be caused by the location of the chassis or the density of the plug-in module assemblies positioned in the chassis. Consequently, connectors positioned at the leading end of the plug-in module assemblies may engage the housing of the chassis when insertion occurs, causing damage to the connectors.

It would be, therefore, beneficial to provide a guide module which can be positioned the plug-in module assembly to guide the plug-in module assembly into the slot of the chassis without damaging the electrical connector provided at the leading end or edge. It would also be beneficial to provide a guide module which allows the electrical connector to have a higher contact count while still being guided into the slot of the chassis.

SUMMARY OF THE INVENTION

An embodiment is directed to a guide module for use with a plug-in module assembly to properly position the plug-in module in a slot of a chassis. The guide module has a leading surface and oppositely facing trailing surface. The guide module has a top wall, a bottom wall, a first inside side wall and an oppositely facing second outside side wall. The leading surface of the guide module extends beyond a leading end of the plug-in module assembly. As the plug-in module is inserted into the chassis, the leading surface of the guide module prevents damage to other components of the plug-in module assembly.

An embodiment is directed to a plug-in module assembly configured to be inserted into a slot of a chassis. The plug-in module assembly has a leading end and a trailing end. The plug-in module assembly has a cover, a frame, at least one substrate, and one or more connectors extending from the leading end. Guide modules extend from the leading end in a direction away from the trailing end. The guide modules are positioned proximate the one or more connectors. The guide modules have leading surfaces and oppositely facing trailing surfaces. The guide modules have top walls, bottom walls, first inside side walls and oppositely facing second outside side walls. The leading surfaces of the guide modules extend beyond the leading end of the plug-in module assembly. As the plug-in module is inserted into the slot of the chassis, the leading surfaces of the guide modules prevent damage to other components of the plug-in module assembly.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
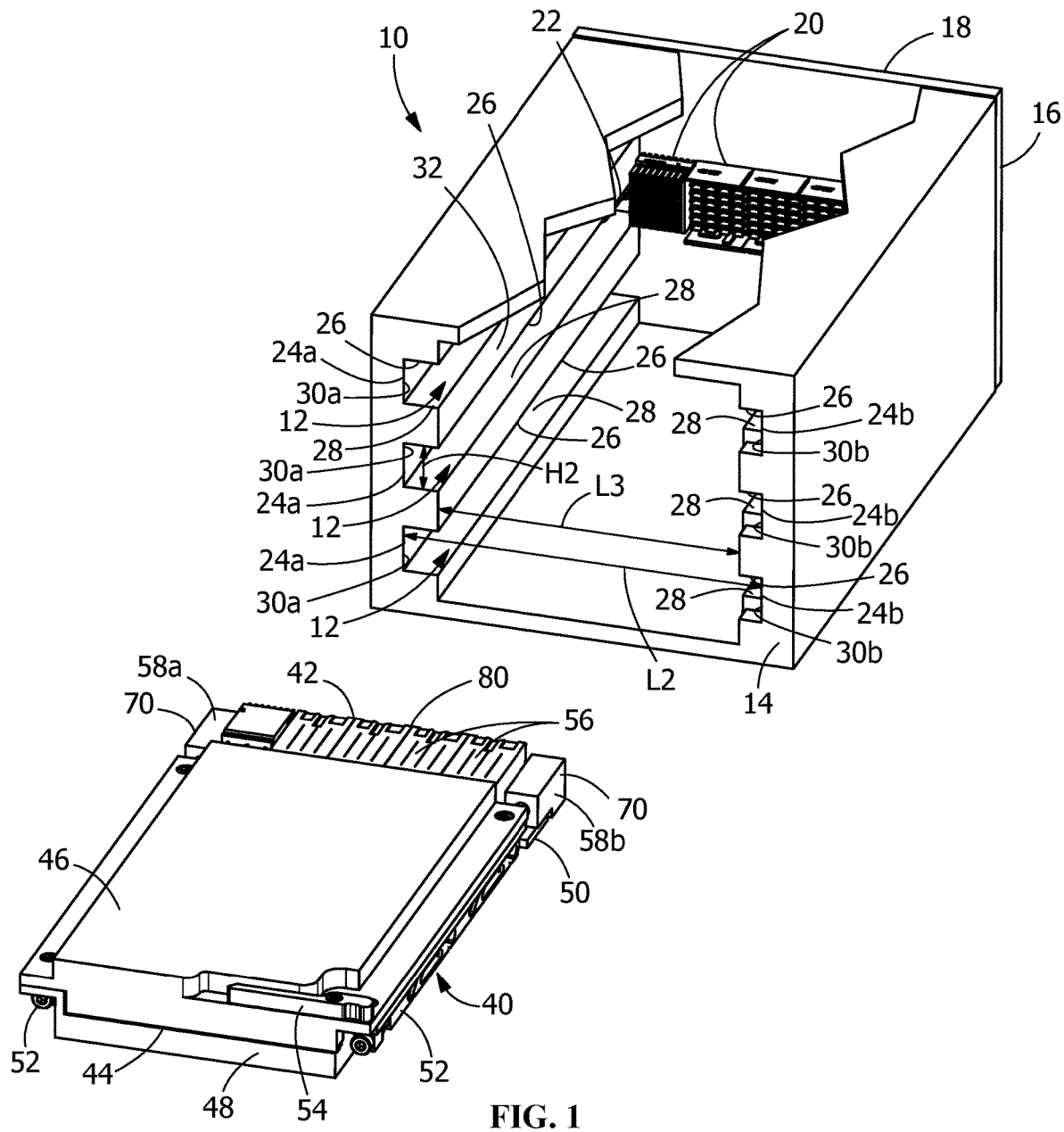
FIG. 1 is perspective view of a plug-in module assembly prior to insertion into a slot of a chassis, guide modules of the present invention are provided on a leading edge or end of the plug-in module assembly.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

Figure 2:
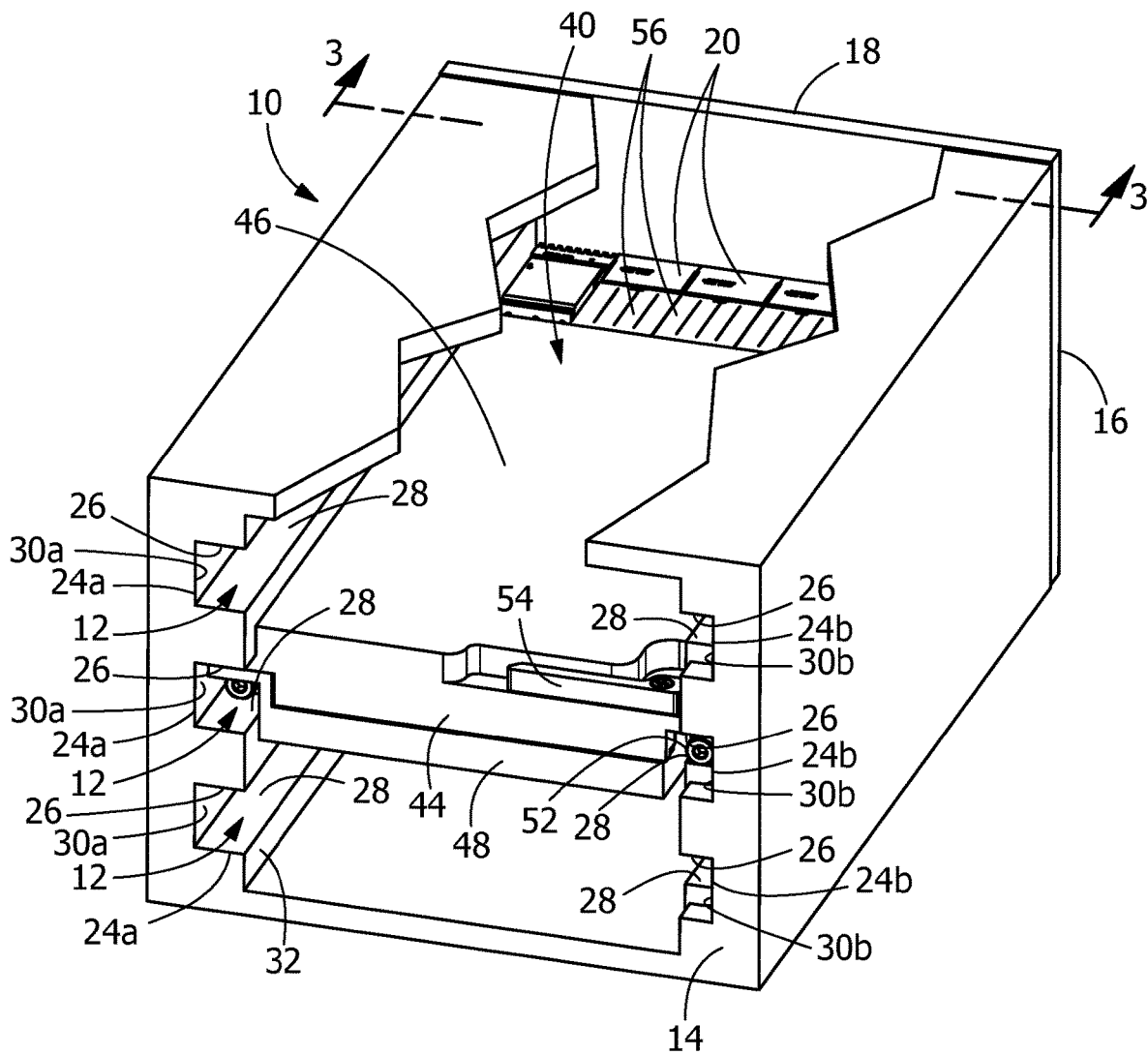
FIG. 2 is a is perspective view of a plug-in module assembly fully inserted into the slot of a chassis.
Figure 3:
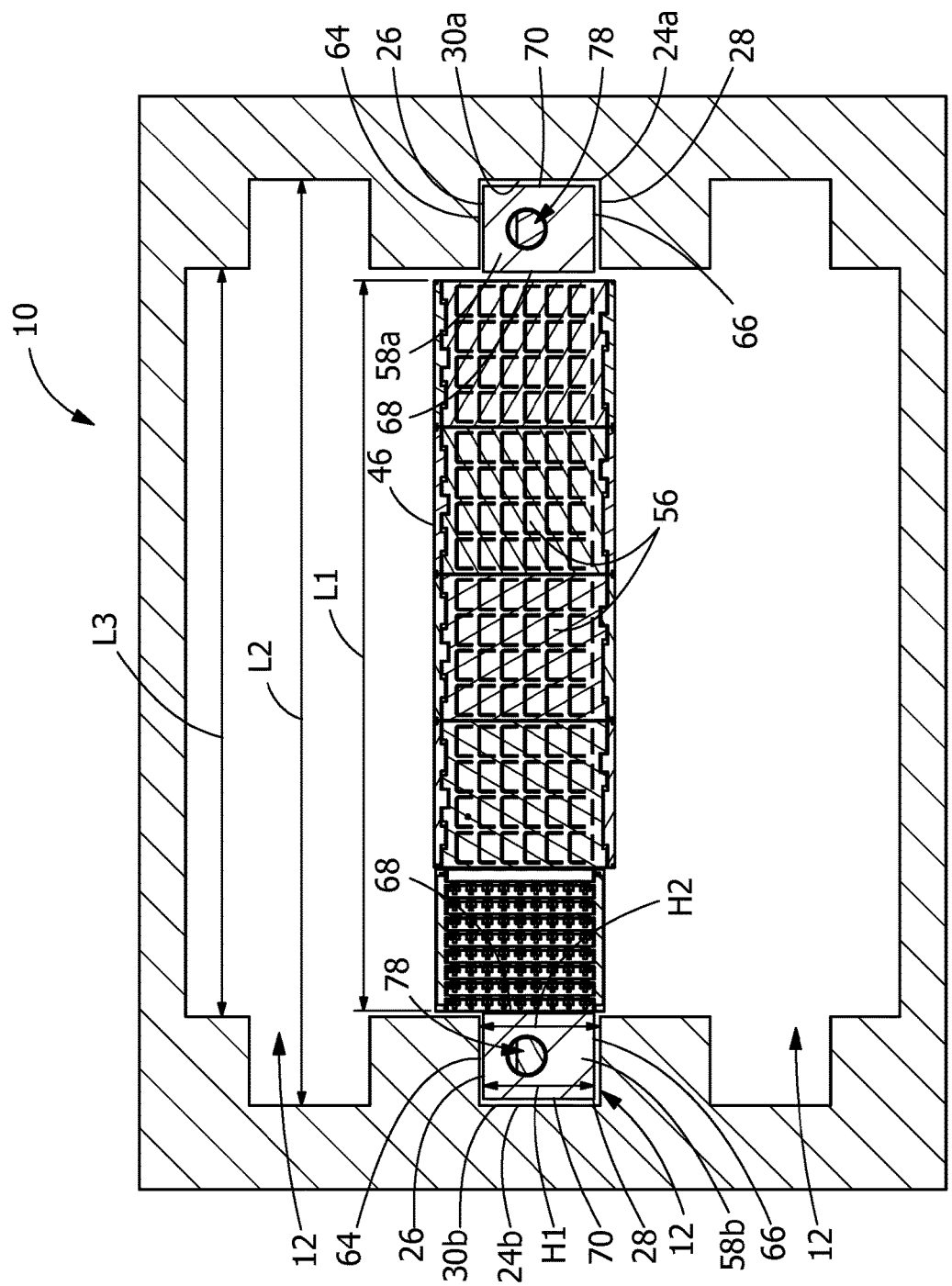
FIG. 3 is a cross-sectional view of the electrical connector assembly taken along line 3-3 of FIG. 2.

As shown in FIGS. 1 and 2, an illustrative chassis 10 has three slots 12 which extend from a first or mating surface 14 to a second or backplane mounting surface 16. A backplane 18 is mounted to the backplane mounting surface 16. The chassis 10 is meant to be illustrative, as the shape, configuration and number of slots may vary.

The backplane 18 has one or more mating connectors 20 provided thereon. Guideposts 22 extend from the backplane 18 in the same direction as the mating connectors 20. In the illustrative embodiment shown, two guideposts 22 are shown. The backplane 18, mating connectors 20 and guideposts 22 are illustrative and not limiting.

Each of the slots 12 has guide rails 24 positioned on either end thereof. Each of the guide rails 24 has a top wall 26, a bottom wall 28 and an end wall 30 which extends between the top wall 26 and the bottom wall 28. The end wall 30a of guide rail 24a faces the end wall 30b of guide rail 24b. The guide rails 24 are offset from interior side walls 32 of the chassis 10.

Plug-in module assemblies 40, as shown in FIG. 2, are configured to be inserted into the slots 12. As shown in FIGS. 1 through 6, each plug-in module assembly 40 has a leading or mating edge or end 42 and a trailing edge or end 44. Each plug-in module assembly has a cover 46, a frame 48, at least one circuit board or substrate 50, retainers 52, one or more ejectors 54, one or more connectors 56 and guide modules 58. The one or more connectors 56 extend from the leading end 42 in a direction away from the trailing end 44. The one or more connectors 56 are mechanically and electrically connected to the circuit board 50. The connectors 56 may have power or signal contacts which extend therethrough based on the application in which the plug-in module assemblies 40 are used. The cover 46, the frame 48, the at least one circuit board or substrate 50, the retainers 52, the one or more ejectors 54, and the one or more connectors 56 are known in the industry, and can be, for example, of the type described in the ANSINITA 48.2-2020 standard, which is incorporated herein in its entirety.

Figure 4:
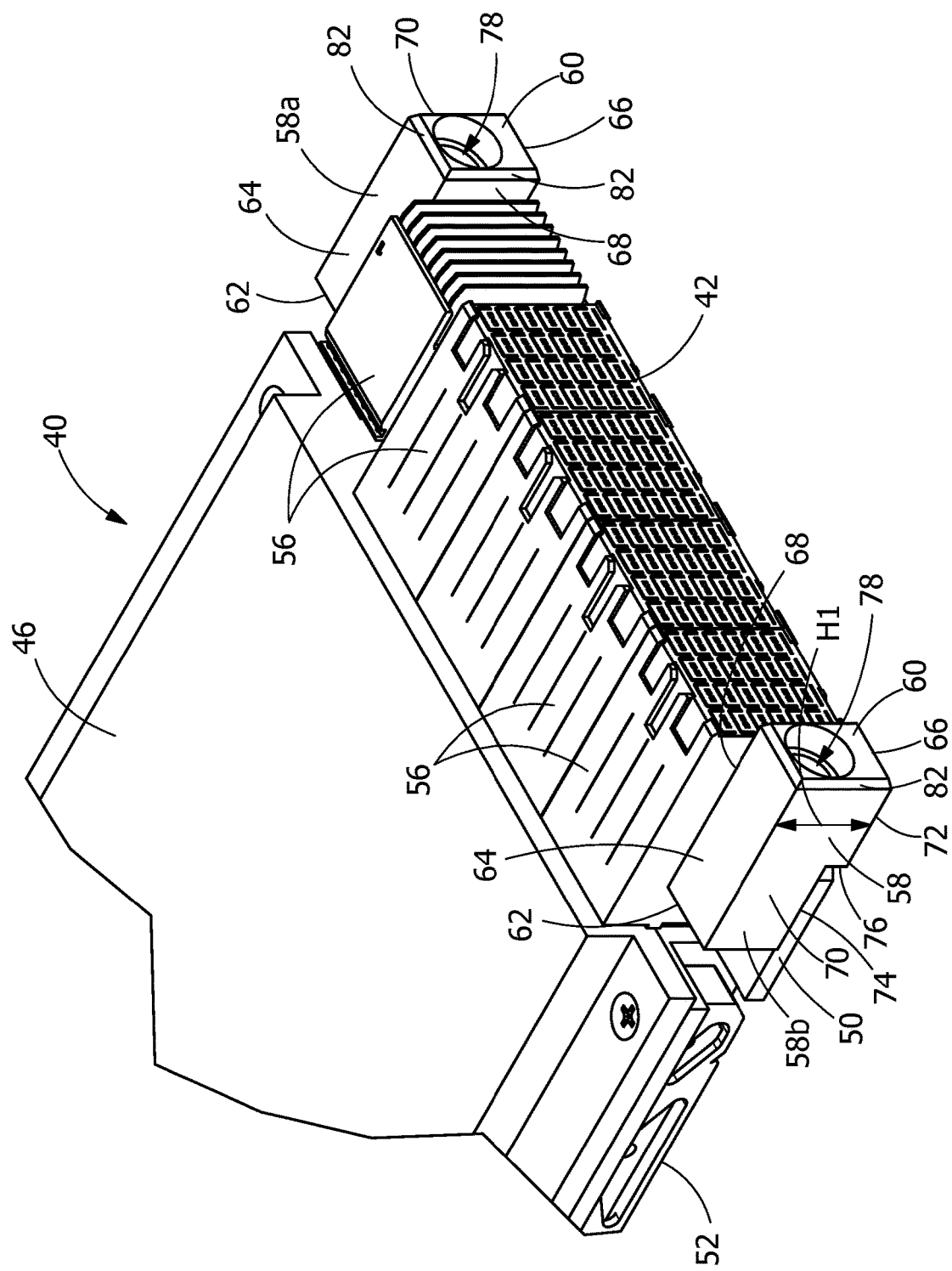
FIG. 4 is an enlarged perspective view of the leading end of the plug-in module with guide modules provided on either end of the leading end.
Figure 5:
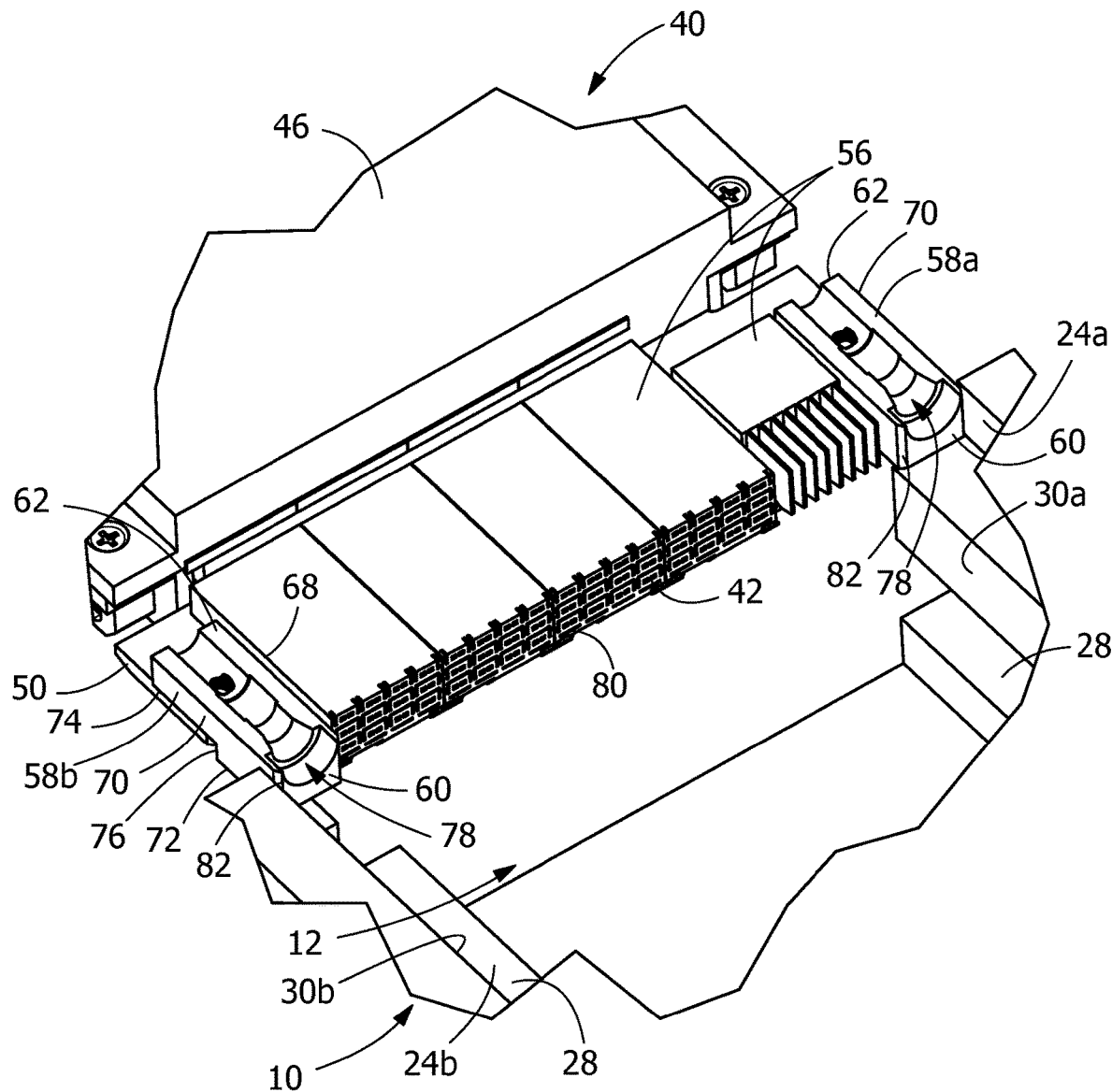
FIG. 5 is cross-sectional showing the plug-in module as it is brought into position with the slot of the chassis.
Figure 6:
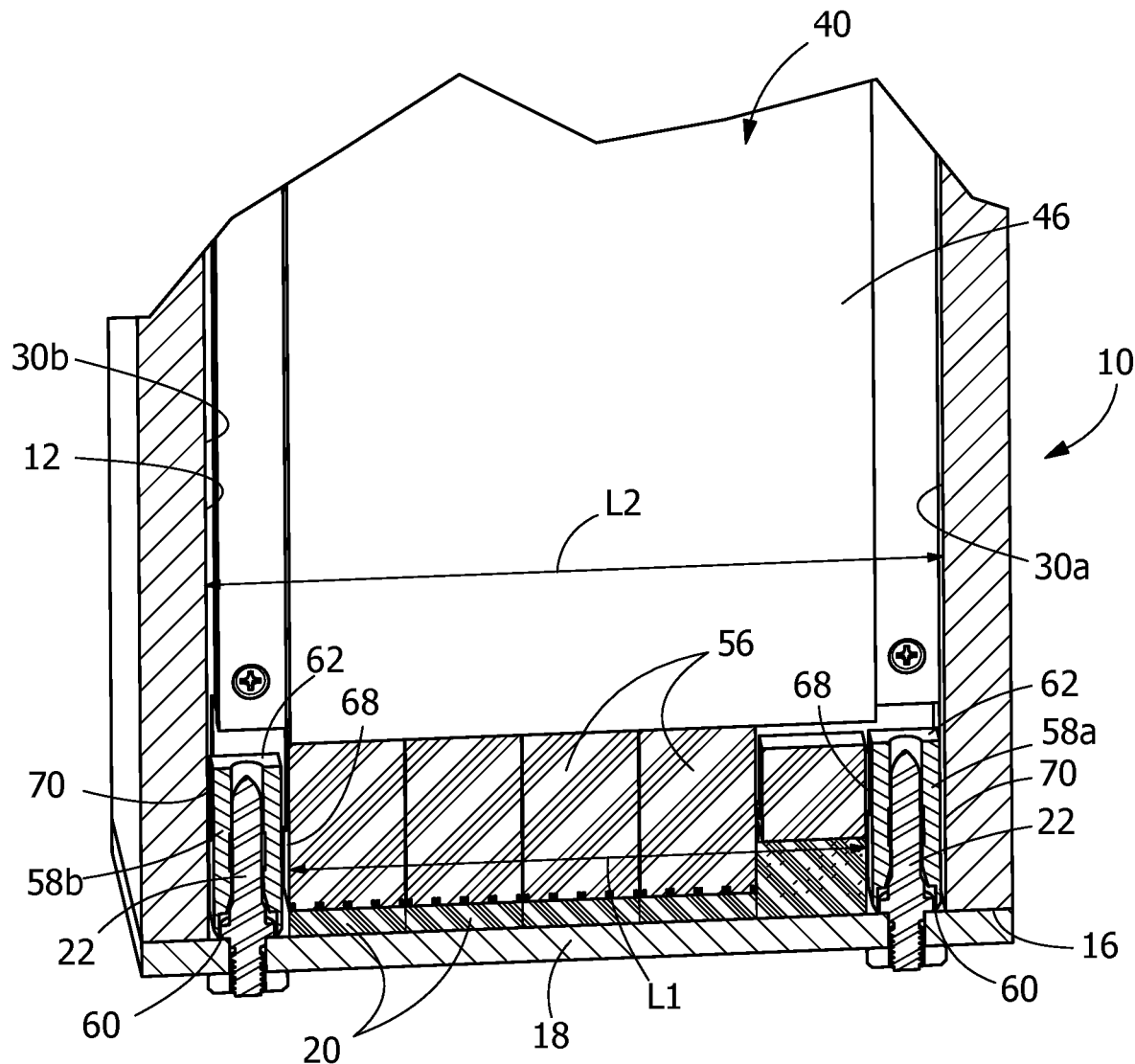
FIG. 6 is cross-sectional showing the plug-in module fully inserted into the slot of the chassis.

As shown in FIGS. 4 through 6, each of the guide modules 58 has a leading surface 60, an oppositely facing trailing surface 62, a top wall 64, a bottom wall 66, a first inside side wall 68 and an oppositely facing second outside side wall 70. The bottom wall 66 has a first surface 72 and a second surface 74. A shoulder 76 extends between the first surface 72 and the second surface 74. The second surface 74 is configured to be mounted on the circuit board or substrate 50. In various illustrative embodiments, the guide modules 58 may be separate members or may be integral portions of either the cover 46 or the frame 48.

Guidepost receiving openings 78 extend from the leading surfaces 60 of the guide modules 58 toward the trailing surfaces 62. As shown in FIG. 5, the guidepost receiving openings 78 have a larger diameter proximate the leading surface 60 to act as a lead-in area as the guideposts 22 are moved into the guidepost receiving openings 78. The larger diameter portion also cooperates with enlarged areas of the guideposts 22 when the plug-in module assembly 40 is fully inserted into the chassis 10 and mated with the backplane 18.

As shown in FIGS. 4 through 6, the leading surfaces 60 of the guide modules 58 extend beyond mating surfaces 80 of the connectors 56. The leading surfaces 60 extend beyond any other surface or portion of the leading or mating edge or end 42 of the plug-in module assembly 40. Angled surfaces 82 extend from the leading surfaces 60. In the embodiment shown, angled surfaces 82 extend on all four sides of the leading surface 60. The angled surfaces 82 act as lead-in surfaces.

As shown in FIGS. 1, 3, 4, 5 and 6, the top walls 64 of the guide modules 58 are spaced from the bottom walls 66 by a distance of H1. The connectors are limited to the space defined by distance L1.

The top walls 26 of the guide rails 24 are spaced from the bottom walls 28 by a distance of H2. End walls 30a of guide rails 24a are spaced from the end walls 30b of guide rails 24b by a distance L2. Interior side walls 32 of the chassis 10 are spaced by a distance L3.

The distance H2 is approximately equal to, but greater than the distance H1. The distance L3 is approximately equal to, but greater than the distance L1. As the dimensions of the slots 12 are larger than the dimensions of the guide modules 58 and the plug-in module assemblies 40, the guide modules and the plug-in module assemblies 40 may be inserted to slid into the slots 12 of the chassis 10 without binding. Due to manufacturing tolerances, the distances H1, H2, L1, L2 and L3 may vary slightly, but are relatively controlled. This allows the movement of the guide modules 58 and the plug-in module assemblies 40 to be controlled as they are inserted into the slots 12 of the chassis 10, thereby preventing damage to the plug-in module assemblies 40 and the chassis 10 and ensuring proper alignment of the plug-in module assemblies 40 relative to the chassis 10.

During insertion of the plug-in module assemblies 40 into the chassis 10, a respective plug-in module assembly 40 is moved into approximate alignment with a respective slot 12 of the chassis 10, as shown in FIG. 1. As the plug-in module assembly 40 are inserted into the slot 12 of the chassis 10, one or both of the guide modules 58 are first to engage the chassis 10. If the plug-in module assembly 40 is properly aligned with the slot 12, the plug-in module assembly 40 is inserted and slid in the slot 12. As this occurs the openings 78 of the guide modules 58 are moved into engagement with the guideposts 22 of the backplane 18, providing precise alignment for the connectors 56 as they engage the mating connectors 20 of the backplane 18.

If the plug-in module assembly 40 is not properly aligned with the slot 12, the leading surface 60 will engage mating surface 14 of the chassis 10. As the leading surface 60 engages the mating surface 14, the connectors 56 do not engage the chassis, thereby preventing damage to the connectors 56 and the terminals extending therefrom. The operator manipulates the plug-in module assembly 40 until it is properly aligned with the slot 12. The angled surfaces or lead-in surfaces 82 facilitate the proper positioning of the plug-in module assembly 40 in the slot 12. During this alignment process, the leading surface 60 is the only portion of the plug-in module assembly 40 that is contact with the mating surface 14, thereby preventing damage to the other components of the plug-in module assembly 40.

As the guide modules 58 are dimensioned to have dimension H1 be approximate to, but slightly smaller than the dimension H2 of the guide rails 24, the guide modules 58 are positioned in the guide rails 24 during insertion and do not extend into the remainder of the slots 22. This allows the distance L1 of the plug-in module assembly 40 to be only slightly less than the distance L3 between the interior side walls 32 of the chassis. The alignment of the guide modules 58 into the guide rails 24 prevents damage from occurring to the connectors 56 during the mating process. As the distance L1 is only slightly less than L3, and as the distance L1 is the amount of space available for the connectors 56, the available space for the connectors 56 on the plug-in module assembly 40 is maximized to allow for additional terminals to be positioned in the connectors 56 than was previously available.

Figure 7:
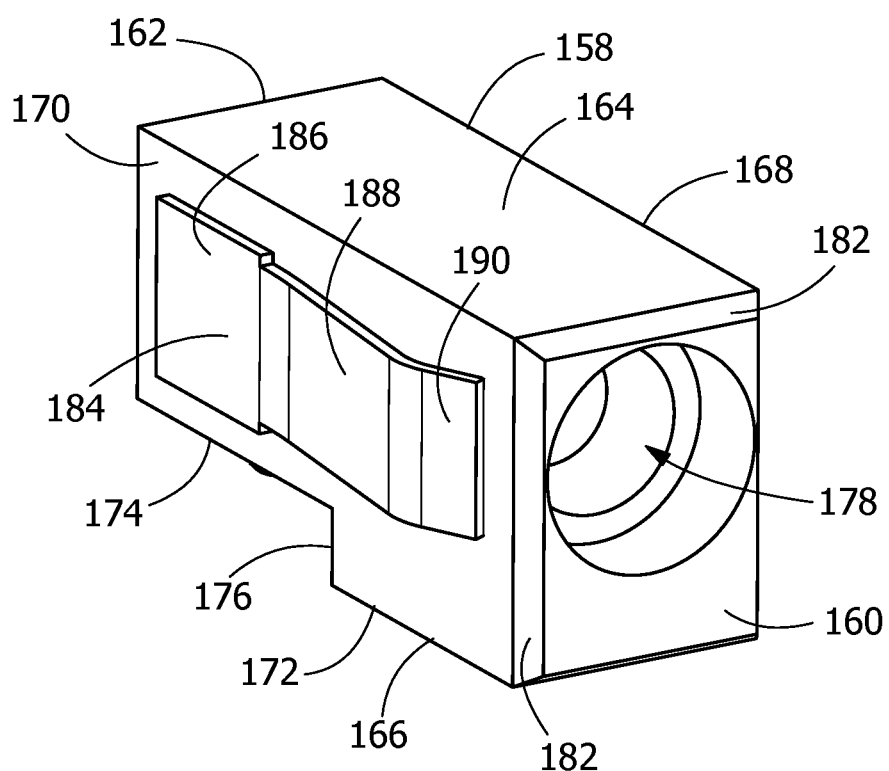
FIG. 7 is a perspective view of an alternate guide module of the present invention.

Referring to FIG. 7, an alternative embodiment of the guide module 158 is shown. Each of the guide modules 158 has a leading surface 160, an oppositely facing trailing surface 162, a top wall 164, a bottom wall 166, a first inside side wall 168 and an oppositely facing second outside side wall 170. The bottom wall 166 has a first surface 172 and a second surface 174. A shoulder 176 extends between the first surface 172 and the second surface 174. The second surface 174 is configured to be mounted on the circuit board or substrate 50.

Guidepost receiving openings 178 extend from the leading surfaces 160 of the guide modules 158 toward the trailing surfaces 162. The guidepost receiving openings 178 have a larger diameter proximate the leading surface 160 to act as a lead-in area as the guideposts 22 are moved into the guidepost receiving openings 178. The larger diameter portion also cooperates with enlarged areas of the guideposts 22 when the plug-in module assembly 40 is fully inserted into the chassis 10 and mated with the backplane 18. Angled surfaces 182 extend from the leading surfaces 160. In the embodiment shown, angled surfaces 182 extend on all four sides of the leading surface 160. The angled surfaces 182 act as lead-in surfaces.

A compliant member 184 is attached to the outside side wall 170. The compliant member 184 may be mounted to the guide module 158 using known mounting techniques. The compliant member 184 has a mounting section 186, a chassis engaging section 188 and an end section 190. The chassis engaging section 188 is spaced from the outside side wall 170. The end section 190 is provided in engagement with the outside side wall 170 to provide resiliency to the compliant member 184. Other embodiments of the compliant member 184 may be used.

When the plug-in module assembly 40 is inserted into the slot 12 of the chassis 10, the compliant member 184 engages a respective end wall 30 of a respective guide rail. As this occurs, the chassis engaging section 188 and the end section 190 allow the compliant member 184 to compress to accommodate large tolerances, thereby ensuring that the guide modules 158 and the plug-in module assembly 40 are properly centered in the slot 12 of the chassis 10. In various embodiments, the compliant member 184 may be made from conductive material to allow the compliant member 184 to ground the plug-in module assembly 40 to the chassis 10.

While the invention has been described with reference to a preferred embodiment, it will be understood by those skilled in the art that various changes may be made, and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. A plug-in module assembly configured to be inserted into a slot of a chassis, the plug-in module assembly comprising; a leading end and a trailing end; a cover, a frame, at least one substrate, and one or more connectors extending from the leading end;

guide modules extending from the leading end in a direction away from the trailing end, the guide modules positioned proximate the one or more connectors, the guide modules comprising: leading surfaces and oppositely facing trailing surfaces; top walls, bottom walls, first inside side walls and oppositely facing second outside side walls with compliant members attached thereto; the leading surfaces of the guide modules extending beyond the leading end of the plug-in module assembly; the top walls of the guide module are spaced from the bottom walls of the guide module by a first distance, the first distance being approximately equal to, but less than a second distance that top walls of guide rails of the slot of the chassis are spaced from bottom walls of the guide rails of the slot of the chassis; wherein as the plug-in module is inserted into the slot of the chassis, the leading surfaces of the guide modules prevent damage to other components of the plug-in module assembly.

2. The plug-in module assembly as recited in claim 1, wherein the bottom walls of the guide modules have first surfaces and second surfaces, shoulders extend between the first surfaces and the second surfaces, the second surfaces are configured to be mounted the at least one substrate of the plug-in module assembly.

3. The plug-in module assembly as recited in claim 1, wherein guidepost receiving openings extend from the leading surfaces of the guide modules toward the trailing surfaces, the guidepost receiving openings have a larger diameter proximate the leading surfaces to act as lead-in areas as guideposts of the chassis are moved into the guidepost receiving openings.

4. The plug-in module assembly as recited in claim 1, wherein angled surfaces extend from the leading surfaces.

5. The plug-in module assembly as recited in claim 4, wherein the angled surfaces extend on sides of the leading surfaces.

6. The plug-in module assembly as recited in claim 1, wherein the guide modules are an integral portion of either the cover or the frame.

7. The plug-in module assembly as recited in claim 1, wherein the compliant members have mounting sections, chassis engaging sections and end sections.

8. The plug-in module assembly as recited in claim 7, wherein the chassis engaging sections are spaced from the outside side walls, the end sections are provided in engagement with the outside side walls to provide resiliency to the compliant members.

* * * * *